(12) United States Patent
Inoue et al.

(10) Patent No.: US 11,994,487 B2
(45) Date of Patent: May 28, 2024

(54) MEASURING CONTAINER, MEASURING SYSTEM AND MEASURING METHOD

(71) Applicant: TOYO Corporation, Tokyo (JP)

(72) Inventors: Masaru Inoue, Tokyo (JP); Noriaki Oyabu, Tokyo (JP)

(73) Assignee: TOYO CORPORATION, Tokyo (JP)

( * ) Notice: Subject to any disclaimer, the term of this patent is extended or adjusted under 35 U.S.C. 154(b) by 981 days.

(21) Appl. No.: 16/934,802

(22) Filed: Jul. 21, 2020

(65) Prior Publication Data
US 2020/0348253 A1    Nov. 5, 2020

Related U.S. Application Data

(63) Continuation of application No. PCT/JP2018/007599, filed on Feb. 28, 2018.

(51) Int. Cl.
| | | |
|---|---|---|
| *G01R 27/26* | (2006.01) | |
| *G01N 27/04* | (2006.01) | |
| *G01N 27/06* | (2006.01) | |
| *G01N 27/22* | (2006.01) | |
| *G01R 31/312* | (2006.01) | |

(Continued)

(52) U.S. Cl.
CPC .......... *G01N 27/226* (2013.01); *G01N 27/045* (2013.01); *G01N 27/06* (2013.01); *G01R 27/26* (2013.01); *G01R 27/2605* (2013.01); *G01R 31/312* (2013.01); *G01D 5/24* (2013.01); *G01D 5/2405* (2013.01); *G01D 5/2415* (2013.01)

(58) Field of Classification Search
CPC .... G01N 27/226; G01N 27/045; G01N 27/06; G01N 27/07; G01N 27/333; G01N 27/12; G01N 27/414; G01R 27/2605; G01R 27/26; G01R 31/312; G01D 5/24; G01D 5/2405; G01D 5/2415
USPC ... 324/76.11–76.83, 459, 600, 649, 658, 686
See application file for complete search history.

(56) References Cited

U.S. PATENT DOCUMENTS

| | | | |
|---|---|---|---|
| 2003/0173233 A1 | 9/2003 | Vincent | |
| 2009/0315574 A1* | 12/2009 | Akiyama | G01N 33/2888 324/698 |

(Continued)

FOREIGN PATENT DOCUMENTS

| | | | | |
|---|---|---|---|---|
| CN | 2010-04056 Y | | 1/2008 | |
| CN | 201004056 | * | 1/2008 | ............. G01N 27/22 |

(Continued)

OTHER PUBLICATIONS

Nov. 3, 2022 Chinese official action (and English translation thereof) in connection with Chinese Patent Application No. 2018800894458.

(Continued)

*Primary Examiner* — Raul J Rios Russo
(74) *Attorney, Agent, or Firm* — John P. White

(57) ABSTRACT

A measuring container for measurement of impurity ions in a liquid includes: a first electrode; a first insulation film formed on the first electrode; a second insulation film formed apart from the first insulation film to create a space into which the liquid is to be sealed; a second electrode on which the second insulation film is formed, the second electrode being arranged to face the first electrode; and a seal material having an inlet through which the liquid is injected into the space, the seal material being configured to seal the space.

15 Claims, 4 Drawing Sheets

(51) Int. Cl.
G01D 5/24 (2006.01)
G01D 5/241 (2006.01)

(56) References Cited

U.S. PATENT DOCUMENTS

| | | | |
|---|---|---|---|
| 2012/0019261 A1 | 1/2012 | Bevilacqua, Jr. et al. | |
| 2012/0048733 A1* | 3/2012 | Yu | G01N 27/302 977/700 |
| 2012/0175604 A1 | 7/2012 | Hanna et al. | |
| 2012/0181185 A1* | 7/2012 | Vitushinsky | G01N 27/4141 257/E29.246 |
| 2014/0162348 A1* | 6/2014 | Katsumoto | G01N 33/86 435/287.1 |
| 2016/0003756 A1* | 1/2016 | Suzuki | G01N 27/07 210/85 |

FOREIGN PATENT DOCUMENTS

| | | | |
|---|---|---|---|
| CN | 101294927 A | 10/2008 | |
| CN | 101581685 A | 11/2009 | |
| CN | 101769891 A | 7/2010 | |
| CN | 101982763 A | 3/2011 | |
| CN | 102346242 A | 2/2012 | |
| CN | 102830142 A | 12/2012 | |
| CN | 104316584 A | 1/2015 | |
| JP | S503695 A | 1/1975 | |
| JP | S5850454 A | 3/1983 | |
| JP | 110605/1982 | 1/1984 | |
| JP | H0688798 A | 3/1994 | |
| JP | 6-138067 A | 5/1994 | |
| JP | 70606/1993 | 7/1995 | |
| JP | H11-237353 A | 8/1999 | |
| JP | H11-352089 A | 12/1999 | |
| JP | 2009-002693 A | 1/2009 | |
| JP | 2012-52906 A | 3/2012 | |
| JP | 2014-153271 A | 8/2014 | |
| JP | 2014-153272 A | 8/2014 | |
| JP | 2016-145838 A | 8/2016 | |
| WO | WO 2005/040780 A1 | 5/2005 | |

OTHER PUBLICATIONS

Korean official action dated May 30, 2022 in corresponding Korean Patent Application No. 2020-7023730.
International Search Report dated May 29, 2018 in connection with PCT International Application No. PCT/JP2018/007599.
May 11, 2021 Japanese official action (and English translation thereof) in connection with Japanese Patent Application No. 2020-503178.
English translation of International Preliminary Report on Patentability dated Sep. 10, 2020 in connection with PCT/JP2018/007599.

* cited by examiner

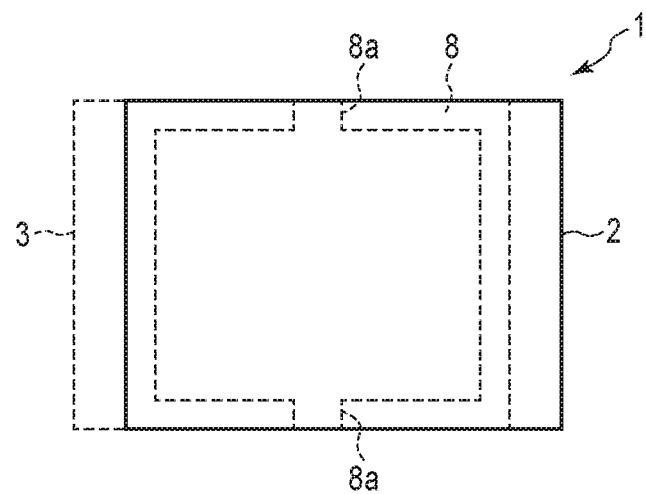
F I G. 1A
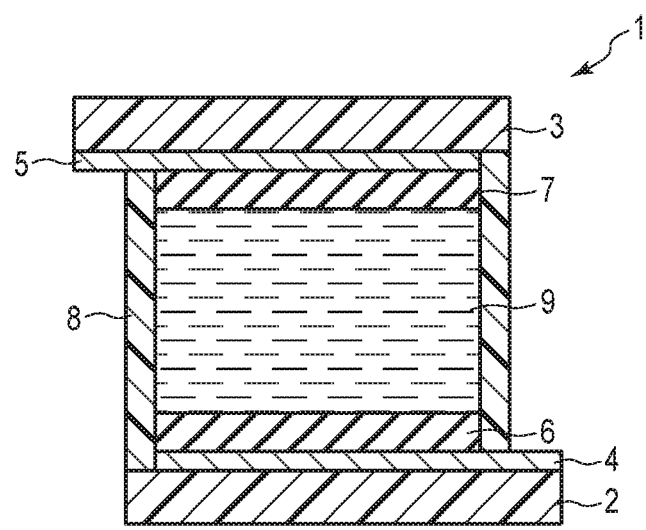
F I G. 1B

MEASURING CONTAINER, MEASURING SYSTEM AND MEASURING METHOD

CROSS-REFERENCE TO RELATED APPLICATIONS

This application is a Continuation Application of PCT Application No. PCT/JP2018/007599, filed Feb. 28, 2018, the entire contents of which are incorporated herein by reference.

FIELD

The present invention relates generally to a measuring container for measurement of impurity ions in liquid, as well as a measuring system and a measuring method using the same.

BACKGROUND

As a liquid employed in the manufacturing process of high-purity organic EL elements or organic semiconductor elements, a high-purity liquid is required which does not contain impurity ions. Such a high-purity liquid may be used as a solvent or solution.

For the measurement of impurity ions, a treasuring method using time of flight (TOF) is disclosed, for example, in U.S. Patent Application Publication No. 2012/0175604.

SUMMARY

According to the measuring method disclosed in the specification of U.S. Patent Application Publication No. 2012/0175604, a charge is injected into an organic substance that is interposed only between electrodes, and the transient current of this time is measured using the TOF. Here, the transient current includes a current due to electron conduction in the measurement targeted organic substance and a current due to ion conduction of impurity ions. With the measuring method of U.S. Patent Application Publication No. 2012/0175604, it is difficult to measure impurity ions of an extremely small amount.

The present invention has been conceived in consideration of the above circumstances, and its purpose is to provide a measuring container for measurement of impurity ions in a liquid, no matter how minute in amount the impurity ions are, as well as a measuring system and a measuring method using this container.

According to a first aspect of the invention, a measuring container for measurement of impurity ions in a liquid comprises: a first electrode; a first insulation film formed on the first electrode; a second insulation film formed apart from the first insulation film to create a space into which the liquid is to be sealed; a second electrode on which the second insulation film is formed, the second electrode being arranged to face the first electrode; and a seal material having an inlet through which the liquid is injected into the space, the seal material being configured to seal the space.

According to a second aspect of the invention, a measuring system for measurement of impurity ions in a liquid comprises: a measuring container for measurement of impurity ions in the liquid, the measuring container comprising a first electrode; a first insulation film formed on the first electrode; a second insulation film formed apart from the first insulation film to create a space into which the liquid is to be sealed; a second electrode on which the second insulation film is formed, the second electrode being arranged to face the first electrode; and a seal material having an inlet through which the liquid is injected into the space, the seal material being configured to seal the space; a voltage signal generator configured to apply a triangular wave voltage signal between the first electrode and the second electrode; and a detection circuit configured to detect a current signal of a current that flows in the liquid in accordance with application of the triangular wave voltage signal.

According to a third aspect of the invention, a measuring method for measurement of impurity ions in a liquid comprises: applying a triangular wave voltage signal between a first electrode and a second electrode with the liquid sealed in a space of a measuring container for measurement of impurity ions in the liquid, wherein the measuring container comprises the first electrode; a first insulation film formed on the first electrode; a second insulation film formed apart from the first insulation film to create the space into which the liquid is to be sealed; the second electrode on which the second insulation film is formed, the second electrode being arranged to face the first electrode; and a seal material having an inlet through which the liquid is injected into the space, the seal material being configured to seal the space; and detecting a current signal of a current that flows in the liquid in accordance with application of the triangular wave voltage signal.

BRIEF DESCRIPTION OF THE DRAWINGS

FIG. 1A is a front view of a measuring container according to the present embodiment.

FIG. 1B is a cross-sectional view of the measuring container according to the present embodiment in which a measurement targeted liquid is injected.

DETAILED DESCRIPTION

Figure 2:
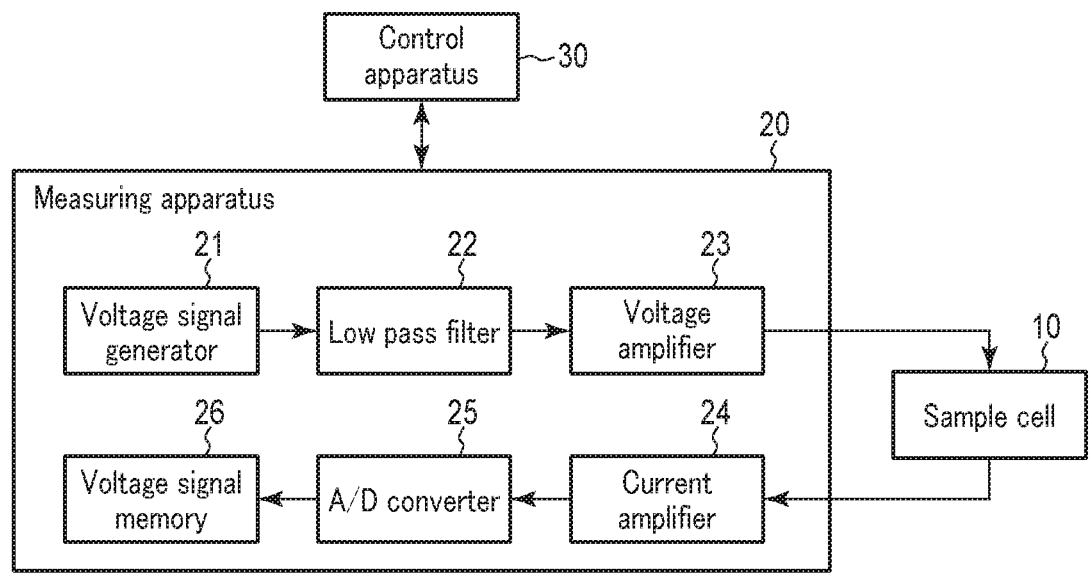
FIG. 2 is a block diagram showing the structure of a measuring system for measurement of impurity ions in the liquid, using the measuring container.

The embodiment of the present invention will be explained below with reference to the drawings. FIG. 1A is a front view of a measuring container according to the present embodiment. FIG. 1B is a cross-sectional view of the measuring container according to the present embodiment in which a measurement targeted liquid is injected.

As illustrated in FIG. 1A, the measuring container 1 according to the present embodiment is a container having an internal space defined by a first substrate 2, a second substrate 3, and a seal material 8 containing a spacer. The seal material 8 is provided with two inlets 8a for the measurement targeted liquid. The inlets 8a may tee closed as needed, after the measurement targeted liquid is injected into the measuring container 1. The inlets 8a need not be closed if evaporation of the liquid or contamination by dissolved substances in the ambient air would not significantly affect the measurement, or if the measurement is conducted for a length of time sufficiently short for these factors to not affect the measurement. The first substrate 2 and second substrate 3 may be glass substrates. The first substrate 2 and second substrate 3, however, are not limited to glass substrates.

A first electrode 4 is provided on the surface of the first substrate 2 facing the inside of the measuring container 1. A second electrode 5 is provided on the surface of the second substrate 3 facing the inside of the measuring container 3. The first electrode 4 may be a plate electrode configured to cover the bottom side of the space formed inside the measuring container 1. Part of the first electrode 4 is pulled from the inside of the measuring container 1 to be exposed to the outside of the measuring container 1. The second electrode 5 may be a plate electrode configured to cover the upper side of the space formed inside the reassuring container 1. Part of the second electrode 5 is also pulled from the inside of the measuring container 1 to be exposed to the outside of the measuring container 1.

The first electrode 4 and second electrode 5 may be indium tin oxide (ITO) electrodes. The first electrode 4 and second electrode 5, however, are not limited to ITO electrodes as long as they are formed of a conductive material that is unreactive with the measurement targeted liquid 9. For example, the first electrode 4 and second electrode 5 may be aluminum (Al) electrodes.

In the measuring container 1 according to the present embodiment, a first insulation film 6 is formed on the surface of the first electrode 4 facing the inside of the measuring container 1. Furthermore, in the measuring container 1 according to the present embodiment, a second insulation film 7 is formed on the surface of the second electrode 5 facing the inside, of the measuring container 1. The first insulation film 6 is an insulation film configured to cover the bottom side of the space inside the measuring container 1. The second insulation film 7 is an insulation film configured to cover the upper side of the space inside the measuring container 1.

The first insulation film 6 and second insulation film 7 demonstrate a resistivity at least 100 times as large as that of the measurement targeted liquid 9. The first insulation film 6 and second insulation film 7 therefore may be formed of a high-resistance insulating material. The insulating material used for the first insulation film 6 and the second insulation film 7, if it is an organic substance, may be polyimide. If it is an inorganic substance, the insulating material used for the first insulation film 6 and the second insulation film 7 may be silicon dioxide ($SiO_2$) or silicon nitride ($SiN_x$). In order to realise a sufficiently high resistivity against the measurement targeted liquid 9, the first insulation film 6 and second insulation film 7 may be formed to be thin.

The seal material 8 seals the measuring container 1 in a manner such that the measurement targeted liquid would not leak from the inside. As mentioned above, the seal material 8 has two inlets 8a. For example, when the inlets 8a are immersed in a container filled with the liquid 9, the liquid 9 enters the space inside the measuring container 1 through capillary action. The seal material 8 contains a spacer such as beads. With this spacer, the seal material 8 maintains a gap between the first insulation film 6 and the second insulation film 7. The gap between the first insulation film 6 and second insulation film 7 may differ among measuring containers. With measuring containers 1 having different gaps corresponding to different liquids 9, the movement of impurity ions in each liquid 9 can be measured, in the above example, the liquid enters the measuring container 1 through capillary action. If capillary action is not adopted, only one inlet 8a may be arranged. The inlets 8a may include three or more inlets.

As illustrated in FIG. 1B, the measurement targeted liquid 9 is sealed into the space defined by the first insulation film 6, second insulation film 7 and seal material 8. That is, according to the present embodiment, the liquid 9 is held between the first insulation film 6 and second insulation film 7, and also between the first electrode 4 and second electrode 5. The measurement targeted liquid 9 may be any liquid that may contain impurity ions.

The measuring container 1 does not always need to include the first substrate 2 and second substrate 3. However, the formation of the first electrode 4 and second electrode 5 on the first substrate 2 and second substrate 3 facilitates the handling of the container.

FIG. 2 is a block diagram showing the structure of the measuring system for the measurement of impurity ions in the liquid, using the measuring container 1. In the following description, the measuring container 1 with the liquid 9 injected will be referred to as a sample cell 10. As illustrated in FIG. 2, the measuring system includes a measuring apparatus 20 and a control apparatus 30. Here, the measuring apparatus 20 and control apparatus 30 are connected to each other in a communicable manner. This communication may be realized in a wired or wireless manner.

Figure 3:
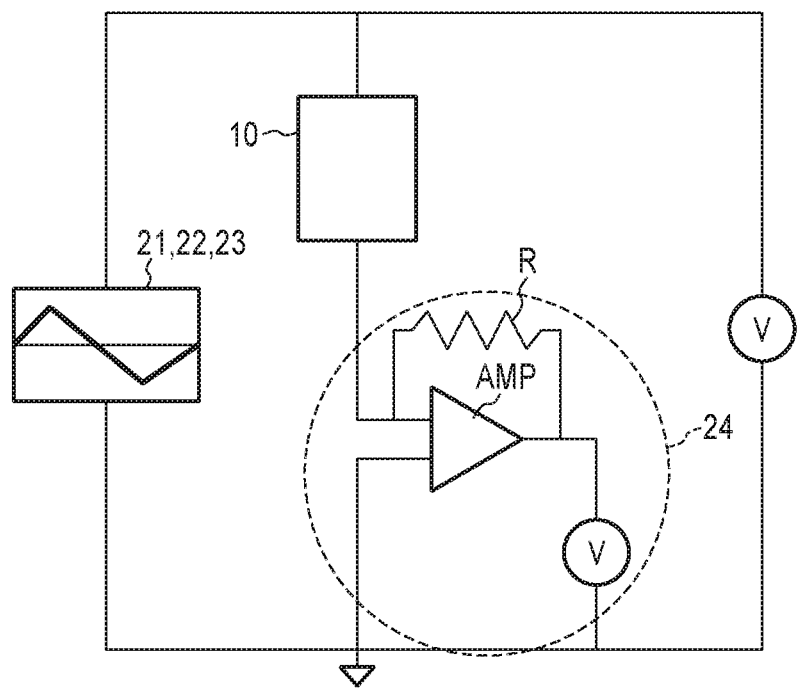
FIG. 3 is a diagram showing an overview of an electric circuit of the measuring apparatus.

The measuring apparatus 20 applies a triangular wave voltage signal to the sample cell 10. Through the application of a triangular wave voltage signal to the sample cell 10, the measuring apparatus 20 detects the current flowing through the liquid 9 in the sample cell 10. As illustrated in FIG. 2, the measuring apparatus 20 includes a voltage signal generator 21, a low pass filter 22, a voltage amplifier 23, a current amplifier 24, an A/D converter 25, and a voltage signal memory 26. FIG. 3 shows the overview of the electric circuit of the measuring apparatus 20.

The voltage signal generator 21 includes a triangular wave generation circuit. The voltage signal generator 21 is configured to vary the sweep frequency of the triangular wave voltage signal in accordance with the setting made by the control apparatus 30. The voltage signal generator 21 is further configured to vary the voltage range of the triangular wave voltage in accordance with the setting made by the control apparatus 30. The voltage range of the triangular wave voltage signal may be defined by the range of a peak, voltage of the triangular wave voltage signal.

The low pass filter 22 removes a high-frequency noise from the triangular wave voltage signal generated by the voltage signal generator 21.

The voltage amplifier 23 amplifies the triangular wave voltage signal that has passed through the low pass filter 72 to a level suitable for the measurement, and applies the amplified triangular wave voltage signal, for example, to the first electrode 4 of the sample cell 10. As illustrated in FIG. 3, the applied voltage of the sample cell 30 is measured. As the applied voltage of the sample cell 10, a voltage estimated from the voltage generated by the voltage signal generator 21 may be adopted.

The current amplifier 24 that serves as a detection circuit amplifies the current that flows through the liquid 9 in the sample cell 10 by applying the triangular wave voltage signal and, at the same time, converts the current to the voltage. As illustrated in FIG. 3, as the output current of the sample cell 10, the voltage converted by the current amplifier 24 is measured. Here, the current amplifier 24 may include a current/voltage conversion circuit, constituted by an operational amplifier AMP having a negative terminal connected, for example, to the second electrode 5 of the sample, cell 10 and a positive terminal grounded, and a resistance R connected between the negative terminal and the output terminal of the operational amplifier AMP, as shown in FIG. 3. The current amplifier 24 is configured to vary the gain in accordance with the setting made by the control apparatus 30.

The A/D converter 25 converts the voltage output as an analog signal from the current amplifier 24 to a digital signal.

The voltage signal memory 26 stores digital voltage values output from the A/D converter 25. The voltage signal memory 26 may be an internal memory of the measuring apparatus 20. The voltage signal memory 26 may be a memory detachably arranged in the measuring apparatus 20.

The control apparatus 30 may be a personal computer (PC). A program for measurement of impurity ions in the liquid is installed in the control apparatus 30. In accordance with the program for the measurement of the impurity ions in the liquid, the control apparatus 30 performs various controls of the measurement in the measuring apparatus 20. Furthermore, in accordance with the program for the measurement of the impurity ions in the liquid, the control apparatus 30 performs various analyses regarding the measurement of impurity ions in the liquid. The control apparatus 30 does not always need to be a PC. The control apparatus 30 may be an apparatus specialized for the measurement of impurity ions in the liquid. The control apparatus 30 may be formed integrally with the measuring apparatus 20.

Figure 4:
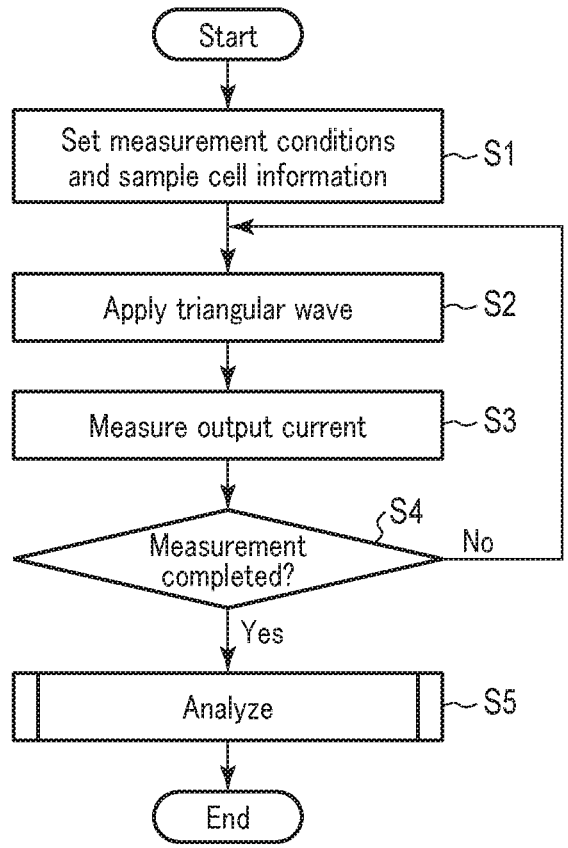
FIG. 4 is a flowchart showing a method for measuring impurity ions in liquid by the measuring system according to the present embodiment.

The operation of the measuring system for the measurement of impurity ions in the liquid using the measuring container 1 will be described below. FIG. 4 is a flowchart showing the measuring method for impurity ions in the liquid by the measuring system according to the present embodiment. The process illustrated in the flowchart of FIG. 4 is controlled by the control apparatus 30.

At step S1, the control apparatus 30 sets the measurement conditions of the measuring apparatus 20 and information of the sample cell 10. The measurement conditions of the measuring apparatus 20 include the sweep frequency of the triangular wave voltage signal. The measurement conditions of the measuring apparatus 20 also include the voltage range of the triangular wave voltage signal. The measurement conditions of the measuring apparatus 20 further include the gain of the current amplifier 24. By suitably adjusting the sweep frequency, the voltage range of the triangular wave voltage signal and the gain of the current amplifier 24, the accuracy of the measurement can be improved, and the measurement time can be shortened. The information of the sample cell 10 includes the name of the liquid 9, the electrode areas of the first electrode 4 and the second electrode 5, and the valve for the gap in the sample cell 10.

At step S2, the control apparatus 30 instructs the measuring apparatus 20 to apply the triangular wave voltage signal to the sample cell 10. Upon receipt of this instruction, the voltage signal generator 21 of the measuring apparatus 20 applies a triangular wave voltage signal including a sweep frequency and a voltage range, which are set by the control apparatus 30.

At step S3, the control apparatus 30 acquires a digital voltage value stored in the voltage signal memory 26 of the measuring apparatus 20. As mentioned above, this digital voltage value corresponds to the value of the current flowing in the sample cell 10.

According to the present embodiment, when the liquid 9 is injected into the measuring container 1, the liquid 9 is held between the first insulation film 5 and second insulation film 7, and is also held between the first electrode 4 and second electrode 5. With the first insulation film 6 interposed between the liquid 9 and first electrode 4, and with the second insulation film 7 interposed between the liquid 9 and second electrode 5, the current flowing in the second electrode 5 is not the sum of the current due to the electron conduction of the liquid and the current due to ion conduction of the impurity ions, but solely depends on the ion conduction of impurity ions. Thus, by amplifying the current flowing in the second electrode 5 with the current amplifier 24, ion conduction of even an extremely small amount can be measured.

The explanation returns to FIG. 4. At step S4, the control apparatus 30 determines whether the measurement should be terminated. For instance, when the application of a triangular wave voltage signal for a predetermined length of time is completed or when the user instructs the termination of the measurement, it is determined that the measurement should be terminated. When it is determined at step S4 that the measurement should not be terminated, the process returns to step S2, and the measurement is continued. When it is determined at step S4 that the measurement should be terminated, the process proceeds to step S5.

Figure 5:
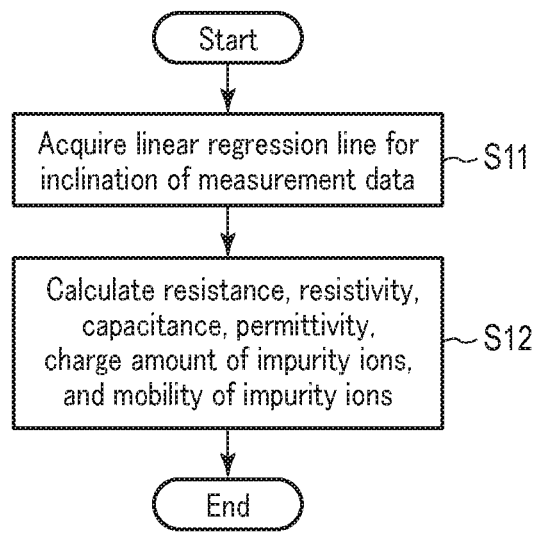
FIG. 5 is a flowchart of an analysis process.
Figure 6:
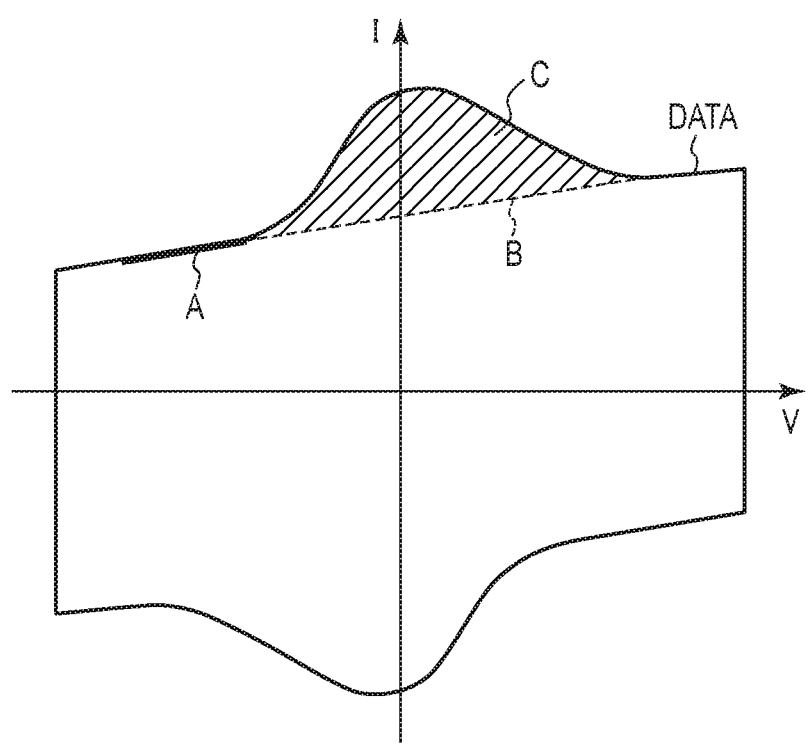
FIG. 6 is a diagram for explaining the analysis process.

At step S5, the control apparatus 30 performs an analysis using the acquired information. After the end of the analysis, the control apparatus 30 terminates the process of FIG. 4. The analysis process will now be explained. FIG. 5 is a flowchart of the analysis process. At the end of the measurement shown in FIG. 4, measurement data DATA as illustrated in FIG. 6 is acquired. The horizontal axis of FIG. 6 represents the voltage applied to the sample cell 10, or in other words the voltage value of the triangular wave voltage signal. The vertical axis of FIG. 6 represents the output current from the sample cell 10. When the liquid 9 contains impurity ions, the measurement data DATA includes the current peak as shown in FIG. 6.

At step S11, the control apparatus 30 acquires a linear regression line that indicates the inclination of the measurement data DATA. For example, the control apparatus 30 acquires a line segment A that fits the inclination of the measurement data DATA. Thereafter, the control apparatus 30 acquires a linear regression line E by extending the line segment A.

At step S12, the control apparatus 20 acquires the resistance and resistivity of the liquid 9 from the linear regression line B. The resistance of the liquid 3 is the reciprocal of the inclination of the linear regression line. The resistivity can be obtained by dividing the product of the resistance and the electrode area by the gap. The control apparatus 30 further obtains the capacitance of the liquid 9 from a segment of the linear regression line B and the sweep frequency of the triangular wave voltage signal. The permittivity can be obtained by dividing the product, of the capacitance and the gap by the product of the electrode area and the vacuum permittivity. The control apparatus 30 further obtains the charge amount of impurity ions. The charge amount of impurity ions is the area of a region C which is a difference between the measurement data DATA and the linear regression line B. The control apparatus 30 also obtains the mobility of the impurity ions based on the charge amount of impurity ions, the electric field obtained from the voltage corresponding to the peak current, and the time at which the peak current is generated. After the various analyses, the control apparatus 30 terminates the process of FIG. 5. FIG. 6 shows an exemplary analysis of the measurement data DATA in the first and second quadrants only, but a similar analysis may also be conducted on the measurement data DATA in the third and fourth quadrants, as needed.

As explained above, the measuring container according to the present embodiment seals the measurement targeted liquid in a manner such that the liquid is held between the insulation films, and further between the electrodes. As a result, ion conduction of even an extremely small amount can be measured in the present embodiment. Furthermore, ion conduction of an inorganic compound and ion conduction of an organic compound are both measurable.

In the present embodiment, the electrodes are prepared by a conductive material that is unreactive with the liquid. Although an insulation film is interposed between each electrode and the liquid, the electrode and liquid may be, at a nanolevel order, brought in contact with each other, considering that the insulation film is formed to be thin. With the electrodes prepared by a conductive material that is unreactive with the liquid, the electrodes would not be deteriorated even if the electrodes are in contact with the liquid.

Moreover, by varying the gap between the insulation films among different measuring containers, the movement of impurity ions travelling in various types of liquid can be measured and inspected.

The present invention has been explained based on the embodiment, but should not be limited thereto. Various modifications and applications can be achieved within the scope of the gist of the invention.

The invention claimed is:

1. A measuring container for measurement of impurity ions in a liquid, the measuring container comprising:
    a first electrode being a plate electrode configured to cover one side of a space formed inside the measuring container;
    a first insulation film formed on the first electrode;
    a second insulation film formed apart from the first insulation film to create the space into which the liquid is to be sealed;
    a second electrode on which the second insulation film is formed, the second electrode being arranged to face the first electrode and being a plate electrode configured to cover the other side of the space; and
    a seal material having an inlet through which the liquid is injected into the space, the seal material being configured to seal the space,
    wherein the first insulation film and the second insulation film are formed to be thin enough to increase a resistivity against the liquid.

2. The measuring container according to claim 1, wherein a resistivity of each of the first insulation film and the second insulation film is at least 100 times as large as a resistivity of the liquid.

3. The measuring container according to claim 1, wherein the first electrode and the second electrode are formed of a conductive material that is unreactive with the liquid.

4. The measuring container according to claim 1, wherein a gap between the first insulation film and the second insulation film differs in accordance with the liquid.

5. The measuring container according to claim 1, wherein the first electrode is formed on a first substrate, and the second electrode is formed on a second substrate arranged to face the first substrate.

6. The measuring container according to claim 1, wherein the inlet includes at least two inlets for injecting the liquid into the space through capillary action.

7. A measuring system for measurement of impurity ions in a liquid, the measuring system comprising:
    a measuring container for measurement of impurity ions in the liquid, the measuring container comprising a first electrode; a first insulation film formed on the first electrode; a second insulation film formed apart from the first insulation film to create a space into which the liquid is to be sealed; a second electrode on which the second insulation film is formed, the second electrode being arranged to face the first electrode; and a seal material having an inlet through which the liquid is injected into the space, the seal material being configured to seal the space;
    a voltage signal generator configured to apply a triangular wave voltage signal between the first electrode and the second electrode; and
    a detection circuit configured to detect a current signal of a current that flows in the liquid in accordance with application of the triangular wave voltage signal.

8. The measuring system according to claim 7, wherein a resistivity of each of the first insulation film and the second insulation film is at least 100 times as large as a resistivity of the liquid.

9. The measuring system according to claim 7, wherein the first electrode and the second electrode are formed of a conductive material that is unreactive with the liquid.

10. The measuring system according to claim 7, wherein a gap between the first insulation film and the second insulation film differs in accordance with the liquid.

11. The measuring system according to claim 7, wherein the first electrode is formed on a first substrate, and the second electrode is formed on a second substrate arranged to face the first substrate.

12. The measuring system according to claim 7, further comprising a control apparatus configured to measure impurity ions in the liquid based on the triangular wave voltage signal and the current signal.

13. The measuring system according to claim 7, wherein the inlet includes at least two inlets for injecting the liquid into the space through capillary action.

14. A measuring method for measurement of impurity ions in a liquid, the measuring method comprising:
    applying a triangular wave voltage signal between a first electrode and a second electrode with the liquid sealed in a space of a measuring container for measurement of impurity ions in the liquid, wherein the measuring container comprises the first electrode; a first insulation film formed on the first electrode; a second insulation film formed apart from the first insulation film to create the space into which the liquid is to be sealed; the second electrode on which the second insulation film is formed, the second electrode being arranged to face the first electrode; and a seal material having an inlet through which the liquid is injected into the space, the seal material being configured to seal the space; and
    detecting a current signal of a current that flows in the liquid in accordance with application of the triangular wave voltage signal.

15. The measuring method according to claim 14, further comprising:
    measuring impurity ions in the liquid based on the triangular wave voltage signal and the current signal.

* * * * *